(12) United States Patent
Yoo

(10) Patent No.: US 10,529,404 B2
(45) Date of Patent: Jan. 7, 2020

(54) METHOD OF OPERATING FERROELECTRIC DEVICE

(71) Applicant: SK hynix Inc., Icheon-si (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/013,957

(22) Filed: Jun. 21, 2018

(65) Prior Publication Data

US 2019/0147935 A1 May 16, 2019

(30) Foreign Application Priority Data

Nov. 15, 2017 (KR) .................. 10-2017-0152635

(51) Int. Cl.
*G11C 11/22* (2006.01)
*H01L 27/11585* (2017.01)

(52) U.S. Cl.
CPC ........ *G11C 11/2297* (2013.01); *G11C 11/223* (2013.01); *H01L 27/11585* (2013.01)

(58) Field of Classification Search
CPC ............... G11C 11/2297; G11C 11/223; H01L 27/11585
See application file for complete search history.

(56) References Cited

U.S. PATENT DOCUMENTS

| 8,139,388 | B2 | 3/2012 | Takahashi et al. |
| 8,867,256 | B2 | 10/2014 | Schwartz |
| 9,697,913 | B1* | 7/2017 | Mariani ............ G11C 11/2293 |
| 2011/0170330 | A1* | 7/2011 | Oezyilmaz ............ B82Y 10/00 365/145 |
| 2015/0263268 | A1* | 9/2015 | Fox ........................ H01L 43/08 257/421 |
| 2016/0027490 | A1* | 1/2016 | Muller ............. H01L 29/78391 365/145 |
| 2016/0172365 | A1* | 6/2016 | McKinnon ............ H01L 28/40 365/145 |
| 2017/0040331 | A1* | 2/2017 | Van Houdt ....... H01L 29/78391 |
| 2018/0277550 | A1* | 9/2018 | Yoo .................... H01L 27/1159 |
| 2018/0358471 | A1* | 12/2018 | Yoo .................. H01L 29/78391 |
| 2019/0066753 | A1* | 2/2019 | Muzzetto ............ G11C 11/2259 |

* cited by examiner

*Primary Examiner* — Toan K Le

(57) ABSTRACT

In a method of operating a ferroelectric device, a ferroelectric device including a first electrode layer, a ferroelectric layer and a second electrode layer that are sequentially disposed is provided. A first remanent polarization is written in the ferroelectric layer. An operating voltage is applied between the first and second electrode layers to write a second remanent polarization having a polarization value different from a polarization value of the first remanent polarization in the ferroelectric layer. An amplitude of the operating voltage varies within a voltage application time period and varies in a set voltage range.

18 Claims, 14 Drawing Sheets

METHOD OF OPERATING FERROELECTRIC DEVICE

CROSS-REFERENCE TO RELATED APPLICATION

The present application claims priority under 35 U.S.C 119(a) to Korean Patent Application No. 10-2017-0152635, filed on Nov. 15, 2017, which is herein incorporated by reference in its entirety.

BACKGROUND

1. Technical Field

Various embodiments of the present disclosure generally relate to a ferroelectric device and a method of operating the same.

2. Related Art

Generally, a ferroelectric material refers to a material having spontaneous electrical polarization in a state in which no external electric field is applied. In addition, the ferroelectric material can be controlled to maintain one of two stable remanent polarization states on a ferroelectricity hysteresis curve. Such property can be utilized in memory devices to store logic information of "0" or "1" in a nonvolatile manner.

SUMMARY

There is disclosed a method of operating a ferroelectric device according to an aspect of the present disclosure. In the method, there is provided a ferroelectric device including a first electrode layer, a ferroelectric layer and a second electrode layer which are sequentially disposed, and in which a first remanent polarization is stored in the ferroelectric layer. An operating voltage is applied between the first and second electrode layers to write a second remanent polarization having a polarization value of an absolute value different from an absolute value of the first remanent polarization in the ferroelectric layer. At this time, an amplitude of the operating voltage varies within a voltage application time period and varies within a set voltage range.

There is disclosed a method of operating a ferroelectric device according to another aspect of the present disclosure. In the method, there is provided a ferroelectric device including a first electrode layer, a ferroelectric layer and a second electrode layer which are sequentially disposed. An operating voltage is applied to the ferroelectric layer to write a predetermined remanent polarization smaller than a maximum remanent polarization on the ferroelectric layer, the operating voltage providing a second saturation electric field lower than a first saturation electric field that generates the maximum remanent polarization for the ferroelectric layer. At this time, applying the operating voltage generates a new ferroelectricity hysteresis behavior including the predetermined remanent polarization in the ferroelectric layer.

DETAILED DESCRIPTION

Figure 1:
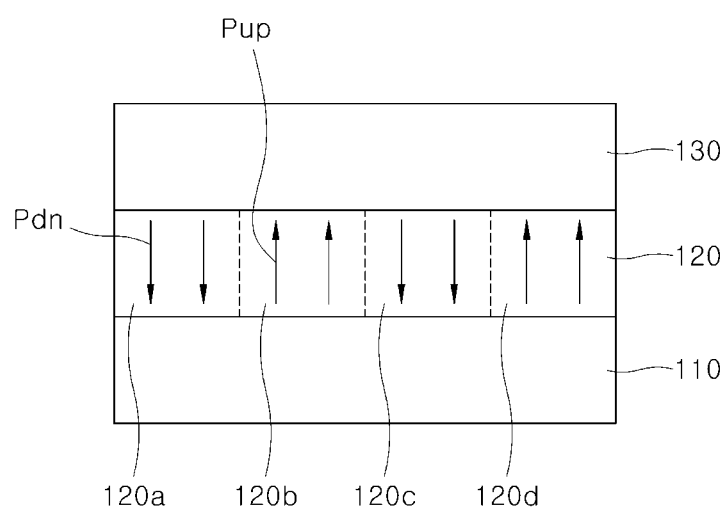
FIG. 1 is a cross-sectional view schematically illustrating a ferroelectric device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a cross-sectional view schematically illustrating a ferroelectric device 1 according to an embodiment of the present disclosure.

Referring to FIG. 1, the ferroelectric device 1 may include a first electrode layer 110, a ferroelectric layer 120, and a second electrode layer 130, which are sequentially disposed on a substrate not illustrated therein. Each of the first electrode layer 110, the ferroelectric layer 120, and the second electrode layer 130 may have a predetermined or set length extending in an x-direction, a predetermined or set width extending in a y-direction, and a predetermined or set thickness extending in a z-direction. In an embodiment, the first electrode layer 110, the ferroelectric layer 120, and the second electrode layer 130 may have substantially the same length and width. In another embodiment, any of the first electrode layer 110, the ferroelectric layer 120, and the second electrode layer 130 may have a different length and width from the other layers. A polarization switching operation region of the ferroelectric device 1 may be a region of the ferroelectric layer 120 where the first electrode layer 110 and the second electrode layer 130 overlap each other.

The ferroelectric device 1 may be disposed on a substrate (not illustrated). The substrate may include, for example, a semiconductor material. Specifically, the substrate may be a silicon (Si) substrate, a gallium arsenide (GaAs) substrate, an indium phosphide (InP) substrate, a germanium (Ge) substrate, a silicon germanium (SiGe) substrate, or a silicon-on-insulator (SOI) substrate, as non-limiting examples. A plurality of integrated circuits may be arranged on the substrate. In an embodiment, a plurality of conductive layers and a plurality of insulating layers may be disposed between the substrate and the first electrode layer 110.

The first electrode layer 110 may be disposed on the substrate. The first electrode layer 110 may include a conductive material. The first electrode layer 110 may include metal, conductive metal nitride, conductive metal oxide, doped silicon, conductive carbide, or a combination of two or more thereof, as non-limiting examples. The first electrode layer 110 may include gold (Au), platinum (Pt), aluminum (Al), ruthenium (Ru), titanium (Ti), iridium (Ir), tungsten (W), titanium nitride (TiN), tantalum nitride (TaN), ruthenium oxide ($RuO_2$), p-type or n-type doped polysilicon, carbon nanotubes and the like, as non-limiting examples.

The ferroelectric material layer 120 may have polarization aligned in different directions depending on the magnitude or direction of an electric field applied from the outside. As an example, the polarization may have a first polarization orientation Pdn aligned from the second electrode layer 130 toward the first electrode layer 110 and a second polarization orientation Pup aligned from the first electrode layer 110 toward the second electrode layer 130. In addition, after the applied external electric field is removed, remanent polarization having the first polarization orientation Pdn or the second polarization orientation Pup may be written in the ferroelectric layer 120 in a nonvolatile manner.

In an embodiment, the ferroelectric layer 120 may have a plurality of domains 120a, 120b, 120c and 120d. Although the first to fourth domains 120a, 120b, 120c and 120d are illustrated as being present in the ferroelectric layer 120 in FIG. 1, the size and the number of domains may not be limited thereto, and the ferroelectric layer 120 may include other various numbers of domains of substantially the same or different sizes and dimensions.

In the first to fourth domains 120a, 120b, 120c and 120d, there may be polarization aligned in the same direction in each domain. As an example, polarization having the first polarization orientation Pdn may be formed in the first domain 120a and the third domain 120c, respectively. In addition, polarization having the second polarization orientation Pup may be formed in the second domain 120b and the fourth domain 120d, respectively. The remanent polarization of the ferroelectric layer 120 may change depending on the magnitude and/or directional bias of the electric field applied from the outside. The manner of changing the remanent polarization will be described later with reference to FIGS. 2A to 2C and FIG. 3.

Referring again to FIG. 1, the second electrode layer 130 may be disposed on the ferroelectric layer 120. The second electrode layer 130 may include a conductive material. A configuration of the second electrode layer 130 may be substantially the same as a configuration of the first electrode layer 110. In an embodiment, the first electrode layer 110 and the second electrode layer 130 may include the same conductive material. In another embodiment, the second electrode layer 130 may include one or more different conductive materials from the first electrode layer 110.

The above-described ferroelectric device 1 may be a ferroelectric random access memory (FRAM) device that implements polarization stored in a nonvolatile manner in the ferroelectric layer 120 as an information signal. The polarization can be controlled or altered in magnitude and direction by an externally applied electric field. As a result, different remanent polarization states can be stored in the ferroelectric layer 120 and correspond to different multi-level information signals upon application of a read voltage.

Figure 2A:
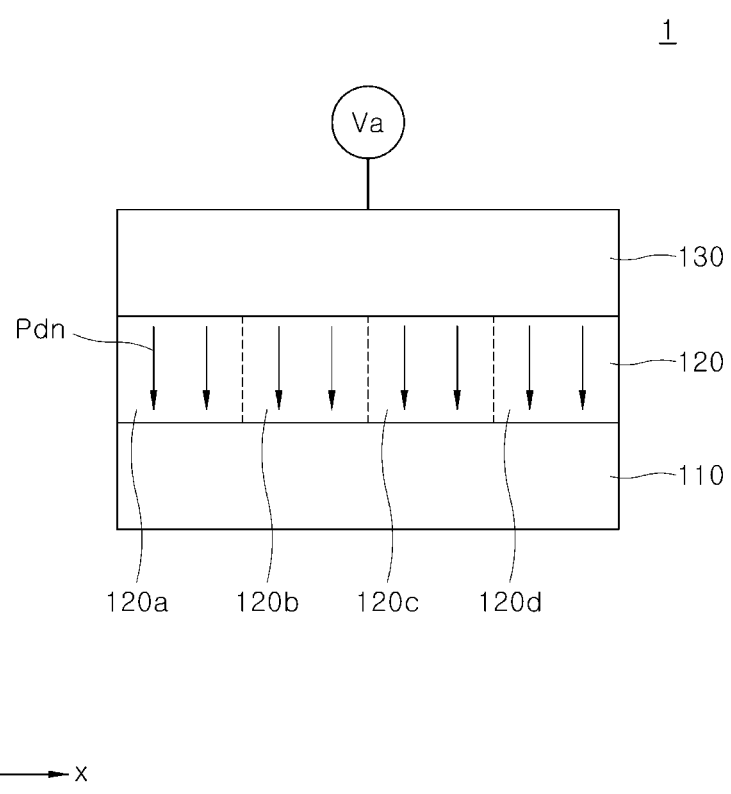
FIGS. 2A to 2C are views schematically illustrating operations of a ferroelectric device according to an embodiment of the present disclosure.
Figure 2B:
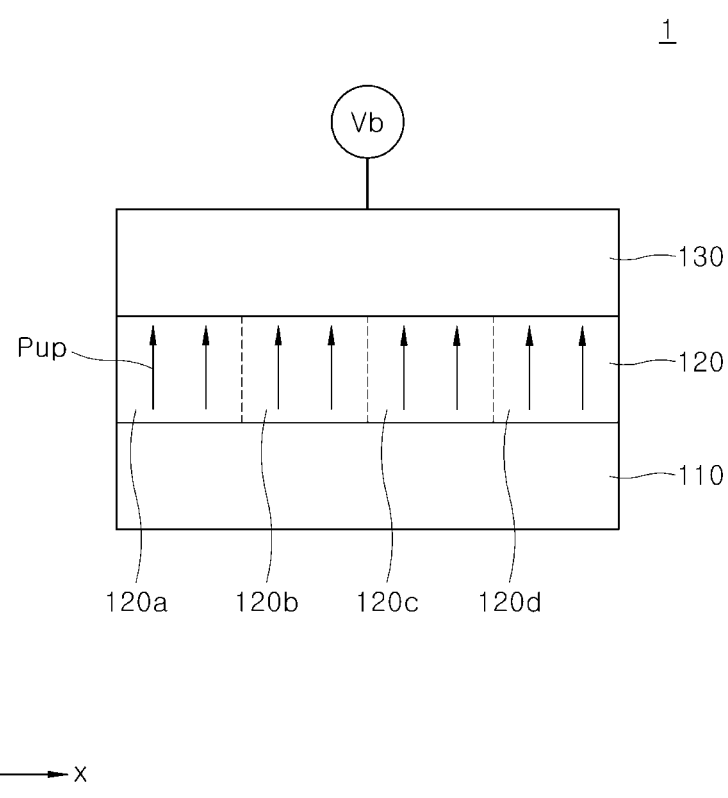
Figure 2C:
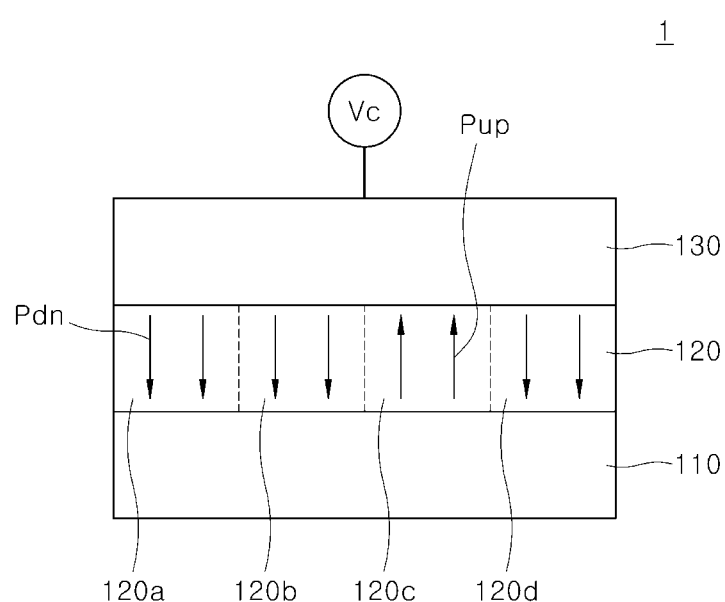
Figure 3:
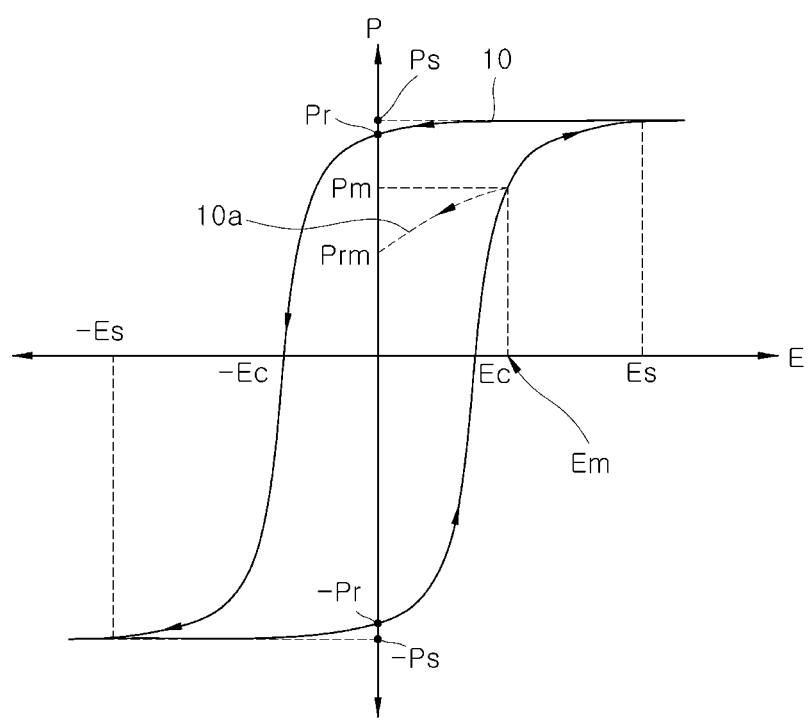
FIG. 3 is a graph schematically illustrating hysteresis characteristics of a ferroelectric layer according to an embodiment of the present disclosure.

FIGS. 2A to 2C are views schematically illustrating operations of a ferroelectric device according to an embodiment of the present disclosure. FIG. 3 is a graph schematically illustrating hysteresis characteristics of a ferroelectric layer according to an embodiment of the present disclosure. The ferroelectric device 1 illustrated in FIGS. 2A to 2C may be the same or substantially the same as the ferroelectric device 1 described above and with reference to FIG. 1.

Referring to FIG. 2A, a first voltage Va may be applied between a first electrode layer 110 and a second electrode layer 130 of the ferroelectric device 1. In an embodiment, before the first voltage Va is applied between the first electrode layer 110 and the second electrode layer 130, the ferroelectric layer 120 may have an initial state having a negative remanent polarization value −Pr on the hysteresis loop in FIG. 3 and all of the domains 120a, 120b, 120c and 120d of the ferroelectric layer 120 may have the second polarization orientation Pup as the remanent polarization orientation. In an embodiment, the first voltage Va may be applied to the second electrode layer 130 by applying a positive bias that varies in magnitude, while the first electrode layer 110 is grounded or maintained at a predetermined or known positive or negative potential. The first voltage Va may be increased in a positive direction from 0 V to switch the polarization from the second polarization orientation Pup to the first polarization orientation Pdn. When the first voltage Va is increased to and beyond a voltage value corresponding to a first coercive electric field Ec of FIG. 3, the number of domains having the first polarization orientation Pdn may be relatively greater than the number of domains maintaining the second polarization orientation Pup by the polarization switching. That is, when the first voltage Va is greater than a voltage corresponding to the first coercive electric field Ec, the ferroelectric layer 120 may have a polarization state having overall the first polarization orientation Pdn through polarization offset between domains having the first polarization orientation Pdn and domains having the second polarization orientation Pup. Here, the voltage value corresponding to the first coercive electric field Ec can be derived by multiplying the first coercive electric field Ec shown in the graph of FIG. 3 by a thickness of the ferroelectric layer 120.

If the first voltage Va is further increased to a voltage value corresponding to a first saturation electric field Es, polarization in the ferroelectric layer 120 in the direction of the first polarization orientation Pdn can be increased to a predetermined saturation polarization value Ps. Thereafter, when the first voltage Va is reduced to 0 V, a first saturation remanent polarization value Pr is retained in the ferroelectric layer 120. The first saturation remanent polarization value Pr may be a maximum remanent polarization value in the ferroelectric layer 120. As illustrated in FIG. 2A, the polarization in the first to fourth domains 120a, 120b, 120c and 120d may have the first polarization orientation Pdn when the remanent polarization having the first saturation remanent polarization Pr is formed in the ferroelectric layer 120. When the remanent polarization having the first saturation remanent polarization Pr is formed in the ferroelectric layer 120, positive charges may be arranged in an inner region of the ferroelectric layer 120 near an interface with the first electrode layer 110, and negative charges may be arranged in an inner region of the ferroelectric layer 120 near an interface with the second electrode layer 130.

Referring to FIG. 2B, a second voltage Vb may be applied between the first electrode layer 110 and the second electrode layer 130. In an embodiment, before the second voltage Vb is applied between the first electrode layer 110 and the second electrode layer 130, the ferroelectric layer 120 may have an initial state having the first saturation remanent polarization value Pr on the hysteresis loop of FIG. 3 and may have the first polarization orientation Pdn of FIG. 2A as a remanent polarization orientation. In an embodiment, the second voltage Vb may be applied to the second electrode layer 130 by applying a negative bias that varies in magnitude, while the first electrode layer 110 is grounded or is maintained at a predetermined or set positive or negative potential. The second voltage Vb may be increased in absolute value in a negative direction from 0 V to switch the polarization from the first polarization orientation Pdn to the second polarization orientation Pup. When the second voltage Vb increases beyond a voltage value corresponding to a second coercive electric field −Ec of FIG. 3, the number of domains having the second polarization orientation Pup may be relatively greater than the number of domains maintaining the first polarization orientation Pdn by the polarization switching. That is, when the second voltage Vb in absolute value is greater than the a voltage corresponding to the second coercive electric field −Ec in absolute value, the ferroelectric layer 120 may have a polarization state having overall the second polarization orientation Pup through polarization offset between domains having the first polarization orientation Pdn and domains having the second polarization orientation Pup. Here, the voltage value corresponding to the second coercive electric field −Ec can be derived by multiplying the second coercive electric field −Ec, shown in the graph of FIG. 3, by a thickness of the ferroelectric layer 120.

Meanwhile, if the second voltage Vb is increased in a negative direction to a voltage value corresponding to the second saturation electric field −Es, then the polarization in the ferroelectric layer 120 having the second polarization orientation Pup may reach a predetermined saturation polarization value −Ps. Thereafter, if the second voltage Vb is reduced to 0 V, a remanent polarization having a second saturation remanent polarization −Pr may be formed in the ferroelectric layer 120. An absolute value of the second saturation remanent polarization value −Pr may be the same or substantially the same as an absolute value of the first saturation remanent polarization value Pr. As illustrated in FIG. 2B, when the remanent polarization having the second saturation remanent polarization value −Pr is formed in the ferroelectric layer 120, the polarization in the first to fourth domains 120a, 120b, 120c and 120d may have the second polarization orientation Pup. When the second saturation remanent polarization −Pr is formed in the ferroelectric layer 120, negative charges may be arranged in the inner region of the ferroelectric layer 120 near an interface with the first electrode layer 110 and positive charges may be arranged in the inner region of the ferroelectric layer 120 near an interface with the second electrode layer 130.

Referring to FIG. 2C, a third voltage Vc may be applied between the first electrode layer 110 and the second electrode layer 130 of the ferroelectric device 1. In an embodiment, the third voltage Vc may be applied to the second electrode layer 130 by applying a positive bias that varies in magnitude, while the first electrode layer 110 is grounded or is maintained at a predetermined or set positive or negative potential.

In an embodiment, the third voltage Vc is applied and increased in the positive direction from 0 V with respect to the ferroelectric layer 120. At this time, as an initial state, the ferroelectric layer 120 has the second saturation remanent polarization value −Pr, described above and with reference to FIG. 2B. If the third voltage Vc is increased beyond the voltage value corresponding to the first coercive electric field Ec of FIG. 3, the number of domains having the first polarization orientation Pdn can be relatively greater than the number of domains maintaining the second polarization orientation Pup in the ferroelectric layer 120, as a result of the polarization switching induced by the third voltage Vc. If the third voltage Vc is further increased to a voltage corresponding to a predetermined switching electric field Em in FIG. 3, then the polarization in the ferroelectric layer 120 may be increased to a predetermined polarization value Pm along the hysteresis loop 10 of FIG. 3. Next, if the third voltage is decreased to 0 V, the polarization in the ferroelectric layer 120 may be decreased along a graph 10a that is different from the graph 10 of FIG. 3, so that a first remanent polarization Prm may be formed in the ferroelectric layer 120.

Referring to FIG. 2C, when the remanent polarization having the first remanent polarization value Prm is formed in the ferroelectric layer 120, some domains in the ferroelectric layer 120 may include polarization having the first polarization orientation Pdn, while the remaining domains may include polarization having the second polarization orientation Pup. That is, not all of the polarization orientation of the domains in the ferroelectric layer 120 shown in FIG. 2B are switched from the second polarization orientation Pup to the first polarization orientation Pdn. Referring to FIG. 3, the remanent polarization having the first remanent polarization value Prm can be stored as another information signal different from the remanent polarization having the first saturation remanent polarization value Pr. Thus, only the polarization orientation of some domains among all domains in the ferroelectric layer 120 are switched by applying a voltage, corresponding to an electric field between the first coercive electric field Ec and the first saturation electric field Es, to the ferroelectric layer 120 and then removing the applied voltage. As a result, it is possible to implement ferroelectric layer 120 with a remanent polarization having a predetermined or controlled magnitude. The remanent polarization can differ from the first saturation remanent polarization Pr, which is generated by switching the polarization orientation of the entirety of all domains. For example, a remanent polarization having a polarization value between zero (0) and the first saturation remanent polarization Pr can be implemented in ferroelectric layer 120.

In the same manner, a plurality of different voltages corresponding to the electric field between the first coercive electric field Ec and the first saturation electric field Es may be selectively applied to the ferroelectric layer 120 and then removed, so that a plurality of distinctive remanent polarization values between zero (0) and the first saturation remanent polarization value Pr can be implemented. A plurality of remanent polarization values may be recorded in the ferroelectric layer 120 as different multi-level information signals.

In another embodiment not shown, application of the third voltage Vc may be performed by applying a negative bias that varies in magnitude, while the first electrode 110 is grounded or is maintained at a predetermined positive or negative potential. In an embodiment, the third voltage Vc may be applied while being increased in an absolute value from 0 V in a negative direction with respect to the ferroelectric layer 120. At this time, as an initial state, the ferroelectric layer 120 has the first saturation remanent polarization value Pr, described above and with reference to FIG. 2A.

Subsequently, the remanent polarization having a predetermined magnitude that is different from the second saturation polarization value −Pr may be formed in ferroelectric layer 120 by applying a voltage corresponding to an electric field between the second coercive electric field −Ec and the second saturation electric field −Es of FIG. 3, and then removing the voltage. As a result, a remanent polarization having a polarization value between 0 V and the second saturation polarization value −Pr can be implemented in ferroelectric layer 120.

In the same manner, a plurality of different voltages corresponding to different electric fields between the second coercive electric field −Ec and the second saturation electric field −Es may be selectively applied to the ferroelectric layer 120 and then removed, so that a plurality of distinctive remanent polarization values between zero (0) and the second saturation remanent polarization value −Pr can be implemented. The plurality of remanent polarization values can be stored in the ferroelectric layer 120 as different multi-level information signals.

Figure 4A:
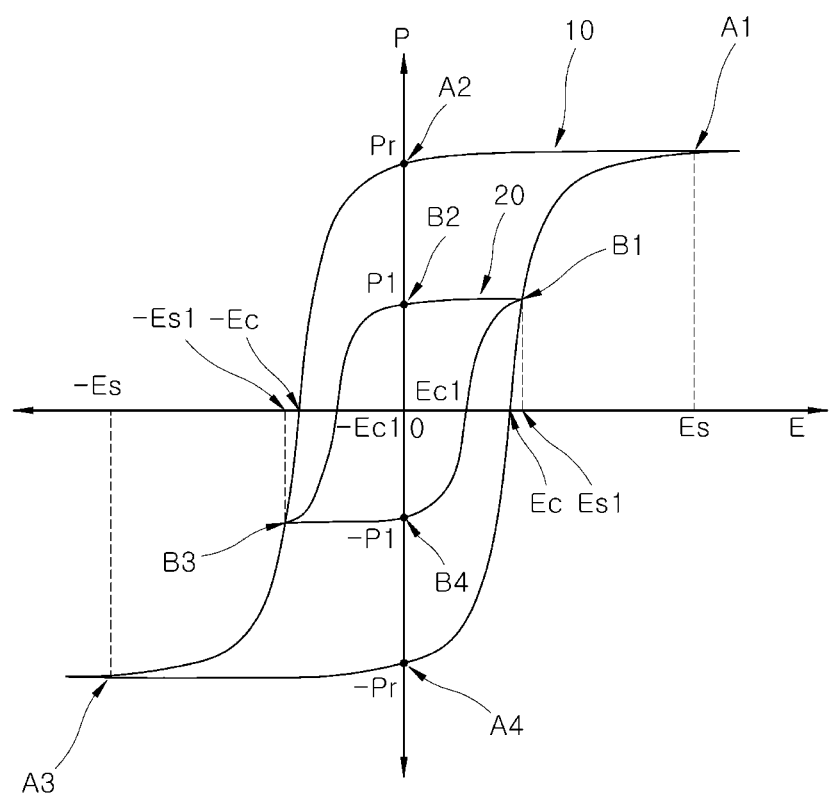
FIG. 4A is a graph schematically illustrating hysteresis properties of a ferroelectric layer of a ferroelectric device according to an embodiment of the present disclosure.
Figure 4B:
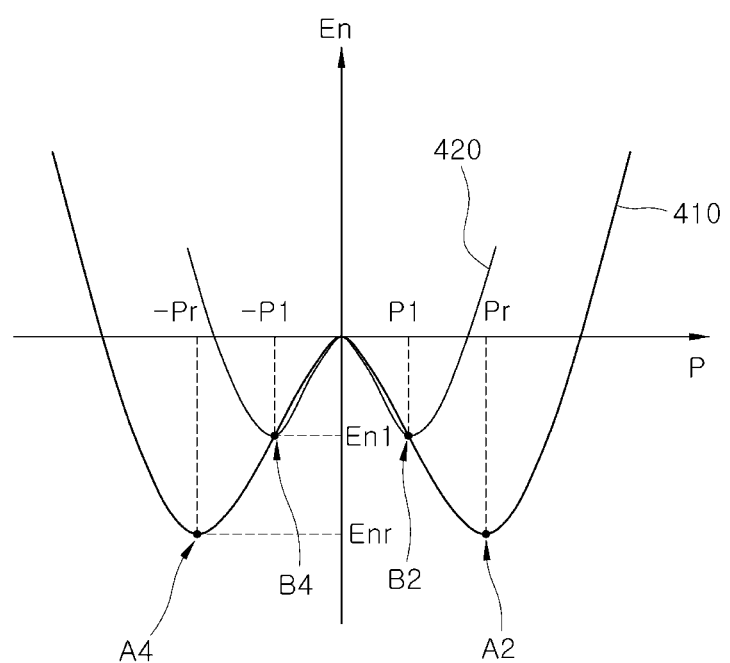
FIG. 4B is a graph schematically illustrating energy states depending on remanent polarization of a ferroelectric device according to an embodiment of the present disclosure.

FIG. 4A is a graph schematically illustrating hysteresis properties of a ferroelectric layer of a ferroelectric device according to an embodiment of the present disclosure. FIG. 4B is a graph schematically illustrating energy states depending on a remanent polarization of the ferroelectric device according to an embodiment of the present disclosure. The graphs in FIGS. 4A and 4B may be graphs representing the electrical properties of the ferroelectric device described above and with reference to FIG. 1. Hereinafter, a method of stabilizing the remanent polarization having an absolute value smaller than the absolute values of the first saturation remanent polarization Pr or the second saturation remanent polarization −Pr in the ferroelectric layer 120, which is described above and with reference to FIGS. 2A to 2C and FIG. 3, will be described with reference to FIGS. 4A and 4B.

Referring to FIG. 4A, the ferroelectric device 1 may have a first hysteresis loop 10 having a first and a second saturation remanent polarization values Pr and −Pr and a first and a second coercive electric fields Ec and −Ec. As described above, the remanent polarizations having the first and second saturation remanent polarization values Pr and −Pr can be generated in the ferroelectric layer 120 by applying operating voltages higher than voltages corresponding to the first and second saturation electric fields Es and −Es, respectively, to the ferroelectric layer 120, and then removing the operating voltages. As an example, in the first hysteresis loop 10, when the electric field applied to the ferroelectric layer 120 is the first saturation electric field Es, polarization having a saturation polarization value corresponding to a first point A1 may be formed.

When the electric field is removed from the ferroelectric layer 120 after the polarization reaches the first point A1, a remanent polarization having the first saturation remanent polarization value Pr corresponding to a second point A2 may be formed in the ferroelectric layer 120. When the electric field applied to the ferroelectric layer 120 is the second saturation electric field −Es, polarization having a saturation polarization value corresponding to a third point A3 may be formed. When the electric field is removed from the ferroelectric layer 120 after the polarization reaches the third point A3, a remanent polarization having the second saturation remanent polarization value −Pr corresponding to a fourth point A4 may be formed in the ferroelectric layer 120.

In addition, the ferroelectric device 1 may have a second hysteresis loop 20 having a third and a fourth remanent polarization values P1 and −P1 and a third and a fourth coercive electric fields Ec1 and −Ec1. The third and fourth remanent polarization values P1 and −P1 can be generated in the ferroelectric layer 120 by applying voltages corresponding to the third and fourth electric fields Es1 and −Es1, respectively, to the ferroelectric layer 120, and then removing the voltages. As an example, in the second hysteresis loop 20, when the electric field applied to the ferroelectric layer 120 is the third electric field Es1, polarization having a polarization value corresponding to a fifth point B1 may be formed in the ferroelectric layer 120.

Next, when the electric field is removed from the ferroelectric layer 120 after the polarization reaches the fifth point B1, a remanent polarization having the third remanent polarization value P1 corresponding to a sixth point B2 may be formed in the ferroelectric layer 120. When the electric field applied to the ferroelectric layer 120 is the fourth electric field −Es1, polarization having a polarization value corresponding to a seventh point B3 may be formed in the ferroelectric layer 120. Then, when the electric field is removed from the ferroelectric layer 120 after the polarization reaches the seventh point B3, a remanent polarization having the second remanent polarization value −P1 corresponding to an eighth point B4 may be formed in the ferroelectric layer 120.

A first energy graph 410 of FIG. 4B is a graph representing a correlation between polarization and energy corresponding to the first hysteresis loop 10, and a second energy graph 420 of FIG. 4B is a graph representing a correlation between polarization and energy corresponding to the second hysteresis loop 20.

Referring again to the first graph 410 of FIG. 4B, the remanent polarization in the ferroelectric layer 120 may have the first and second saturation remanent polarization values Pr and −Pr at the second and fourth points A2 and A4, respectively. At this time, the energy Enr of the remanent polarization may be a minimum value of the first energy graph 410 in FIG. 4B. Thus, the remanent polarization can be stabilized in terms of energy. For example, remanent polarization at the fourth point A4 may be switched to the remanent polarization at the second point A2 when an electric field of the first saturation field Es or higher is applied to the ferroelectric layer 120 and then stabilized at the second point A2 after the electric field is removed from the ferroelectric layer 120. In another example, the remanent polarization at the second point A2 can be switched to the remanent polarization at the fourth point A4 when an electric field of the second saturation field −Es or higher is applied to the ferroelectric layer 120 and then stabilized at the second point A4 after the electric field is removed from the ferroelectric layer 120.

In contrast, in the first energy graph 410, when the remanent polarization in the ferroelectric layer 120 is at the sixth and eighth points B2 and B4, corresponding to the third and fourth remanent polarization values P1 and −P1, respectively, the remanent polarization may be in an unstable energy state Ent. That is, at the sixth and eighth points B2 and B4 on the first energy graph 410, the remanent polarization may be relatively unstable, and ferroelectric layer 120 may not be able to reliably maintain the polarization state in terms of energy.

Figure 6A:
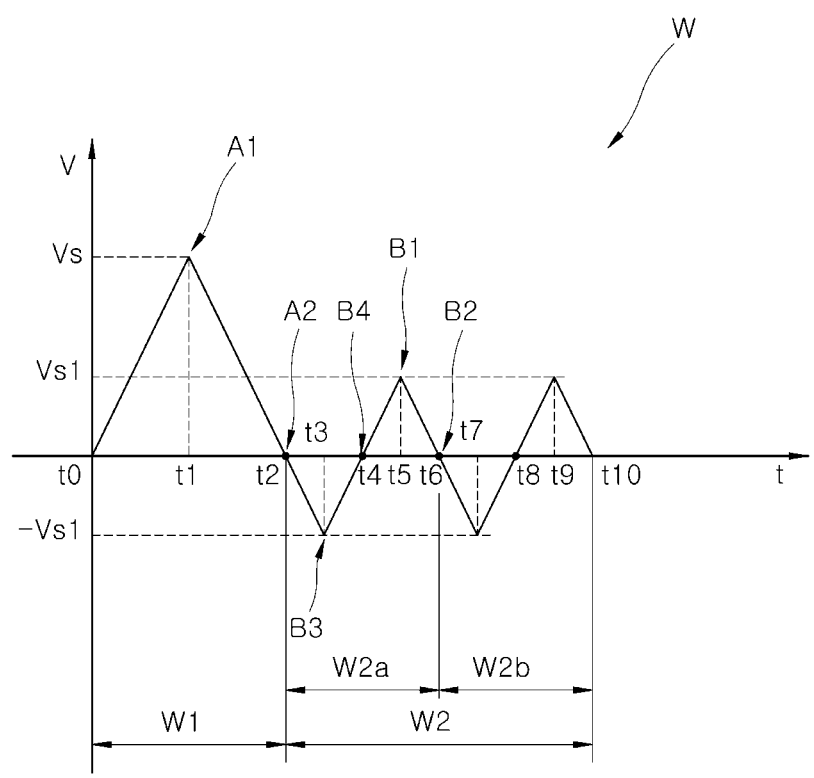
FIG. 6A is a view representing an operating voltage for operating a ferroelectric device in an embodiment of the present disclosure.
Figure 6B:
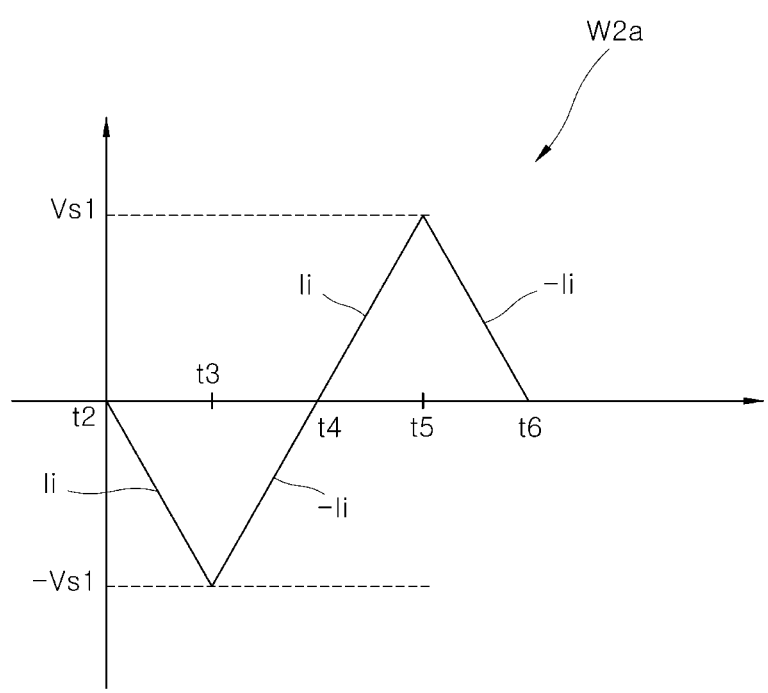
FIG. 6B is an enlarged view of a portion of the operating voltage of FIG. 6A, in an embodiment of the present disclosure.
Figure 7:
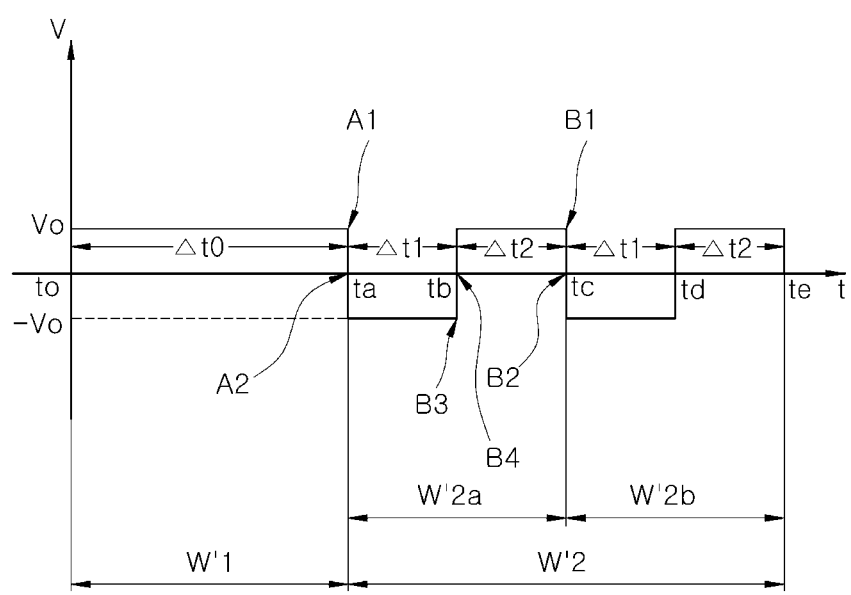
FIG. 7 is a view representing an operating voltage for operating a ferroelectric device, in another embodiment of the present disclosure.

In an embodiment of the present disclosure, the polarization in the ferroelectric layer 120 can be controlled or managed to follow the second hysteresis loop 20 of FIG. 4A by applying an electric field smaller than the first and second saturation electric fields Es and −Es to the ferroelectric layer 120. In an embodiment, a predetermined electric field smaller than the first and second saturation electric fields Es and −Es may be continuously or repeatedly applied to the ferroelectric layer 120 to newly generate a second energy graph 420 for the ferroelectric layer 120. As a result, on the second energy graph 420, the remanent polarization at the sixth and eighth points B2 and B4 can maintain stable polarization states. In an embodiment, the electric field for generating the second energy graph 420 may have a shape in which the magnitude of the electric field changes continuously and periodically depending on the application time, as shown in FIGS. 6A to 6B and FIG. 7 to be described later.

Figure 5:
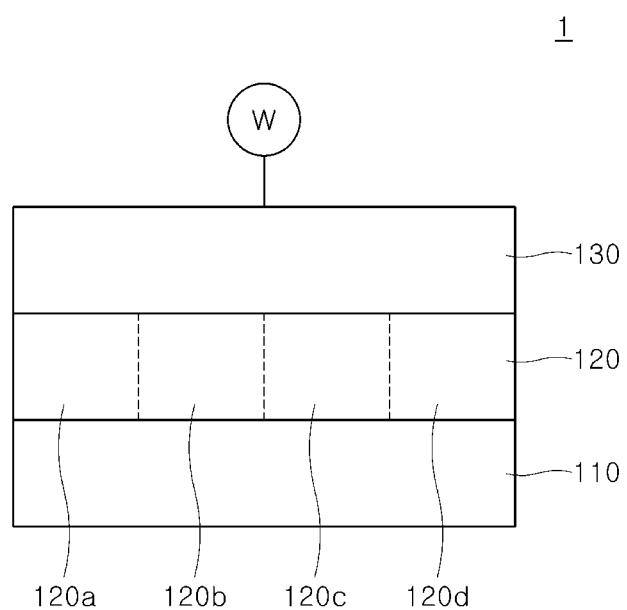
FIG. 5 is a view schematically illustrating a method of operating a ferroelectric device according to an embodiment of the present disclosure.

FIG. 5 is a view schematically illustrating a method of operating a ferroelectric device according to an embodiment of the present disclosure. FIG. 6A is a view representing an operating voltage for operating a ferroelectric device in an embodiment of the present disclosure. FIG. 6B is an enlarged view of a portion of the operating voltage of FIG. 6A.

Referring to FIG. 5, the ferroelectric device 1 may be substantially the same as the ferroelectric device 1 described above and with reference to FIG. 1. In addition, the operation of the ferroelectric device 1 may be described using the first and second hysteresis loops 10 and 20 in FIG. 4A.

As illustrated, an operating voltage W may be applied between a first electrode layer 110 and a second electrode layer 130 of the ferroelectric device 1. In an embodiment, the application of the operating voltage W may be performed by applying a bias varying in magnitude to the second electrode layer 130, when the first electrode 110 is grounded. In an embodiment, the operating voltage W may include a first operating voltage W1 and a second operating voltage W2, as illustrated in FIGS. 6A and 6B.

Referring to FIG. 6A, firstly, the first operating voltage W1 may be applied to the ferroelectric layer 120 to generate a remanent polarization at a second point A2, which has a first saturation remanent polarization value Pr along the first hysteresis loop 10 of FIG. 4A. In an embodiment, the first operating voltage W1 may have a shape in which the applied voltage substantially continuously increases from 0 V to a first saturation voltage value Vs from time t0 to time t1. The first saturation voltage value Vs may correspond to a first saturation electric field Es of the first hysteresis loop 10 of FIG. 4A. As an example, the first saturation voltage value Vs may be derived by multiplying the first saturation electric field Es by a thickness of the ferroelectric layer 120. At time t1, the ferroelectric layer 120 can reach the first point A1 of the first hysteresis loop 10, which corresponds to a predetermined saturation polarization value.

Then, the first operating voltage W1 may have a shape in which the applied voltage substantially continuously decreases from the first saturation voltage value Vs to 0 V from time t1 to time t2. At time t2, the ferroelectric layer 120 can reach the second point A2 on the first hysteresis loop 10, which has the first saturation remanent polarization value Pr. As a result, ferroelectric layer 120 has the first saturation remanent polarization value Pr from application of the first operating voltage W1, of which the voltage value substantially continuously increases then decreases from time t0 to time t2.

Referring to FIG. 6A, the second operating voltage W2 may be applied to the ferroelectric layer 120 (which, as described above, has the first saturation remanent polarization value Pr) to generate a remanent polarization at the sixth point B2 on the second hysteresis loop 20 in FIG. 4A, which has a third remanent polarization value P1. In other words, the second operating voltage W2 may be applied to the ferroelectric layer 120 to change the polarization property of the ferroelectric layer 120 to follow the second hysteresis loop 20 from the first hysteresis loop 10 in FIG. 4A. The amplitude of the second operating voltage W2 may vary periodically in a predetermined voltage range, that is, between a first peak voltage value Vs1 and a second peak voltage value −Vs1. Application voltage amplitude depends on the voltage application time. In an embodiment, the second operating voltage W2 may include a plurality of unit voltages W2a and W2b, and each of the unit voltages W2a and W2b may be a minimum unit of the periodically repeatedly applied voltage.

The operation of generating the remanent polarization at the sixth point B2 may include applying the unit voltage of the second operating voltage W2 at least once. In an embodiment, the unit voltage may be repeatedly applied more than once to train or perform the polarization operation in the ferroelectric layer 120 to follow the second hysteresis loop 20.

In FIG. 6A, as an example, the first unit voltage W2a corresponding to a first cycle of the second operating voltage W2 from time t2 to time t6, and the second unit voltage W2b corresponding to a second cycle of the second operating voltage W2 from time t6 to time t10, are illustrated. Although the two unit voltages W2a and W2b are shown as the second operating voltage W2 in FIG. 6A, the present disclosure is not limited thereto, and various numbers of unit voltages can be applied. In FIG. 6B, the first unit voltage W2a of the second operating voltage W2 of FIG. 6A is enlarged and represented.

In an embodiment, the magnitudes of the first and second unit voltages W2a and W2b may be substantially continuously increased or decreased depending on application time. As an example, the first and second unit voltages W2a and W2b may reciprocate between a positive peak voltage value and a negative peak voltage value of the same magnitude with respect to each other on the basis of zero (0) V, depending on the application time. As an example, the first and second unit voltages W2a and W2b may be analog voltage signals. In an embodiment, the first and second unit voltages W2a and W2b may each have a wedge-shaped voltage waveform along the time axis. In an embodiment, the amplitude of the applied voltage may be increased in absolute magnitude from zero (0) V to the second peak voltage value −Vs1 for a time period from time t2 to time t3.

Next, the amplitude of the applied voltage may be decreased in absolute magnitude from the second peak voltage value −Vs1 to zero (0) V for the time period from time t3 to time t4. Then, the amplitude of the applied voltage may be increased from zero (0) V to the first peak voltage value Vs1 for the time period between time t4 and time t5. Subsequently, the amplitude of the applied voltage may be decreased from the first peak voltage value Vs1 to zero (0) V for the time period from time t5 to time t6.

In an embodiment, as illustrated in FIG. 6B, the increase/decrease rate of the applied voltage for the time periods from time t2 to time t6 may be substantially the same. As an example, the increase rate Ii of the applied voltage for the time periods from time t2 to time t3 and from time t4 to time t5 may be substantially the same. In addition, the decrease rate −Ii of the applied voltage for the time periods from time t3 to time t4 and from time t5 to time t6 may be substantially the same. In addition, the increase rate Ii and the decrease rate −Ii of the applied voltage may have the same or substantially the same absolute values.

Referring again to FIGS. 4A and 6A, the second operating voltage W2 may be applied to the ferroelectric layer 120, in which the remanent polarization having the first saturation remanent polarization value Pr is stored by the application of the first operating voltage W1, as follows. In an embodiment, the magnitude of the applied voltage is increased from zero (0) V to a predetermined second peak voltage value −Vs1 for the time period from time t2 to time t3. The second peak voltage value −Vs1 may correspond to a fourth electric field −Es1 on the second hysteresis loop 20 of FIG. 4A. The fourth electric field −Es1 may be greater than the second coercive electric field −Ec on the first hysteresis loop 10. Accordingly, switching of the polarization from the positive polarization value Pr to the negative polarization value corresponding to the seventh point B3 can occur in the ferroelectric layer 120 such that the ferroelectric layer 120 has a polarization state having a switched polarization orientation as a whole. In an embodiment, when the ferroelectric layer 120 has the first polarization orientation Pdn as a whole at the second point A2, the ferroelectric layer 120 has the second polarization orientation Pup as a whole at the seventh point B3 during the application of the second operating voltage W2. However, at the seventh point B3, not all of domains in the ferroelectric layer 120 have the second polarization orientation Pup. Instead, the number of domains having the second polarization orientation Pup may be relatively greater than the number of domains maintaining the first polarization orientation Pdn. As an example, the second peak voltage value −Vs1 can be derived by multiplying the fourth electric field −Es1 by a thickness of the ferroelectric layer 120.

At time t3, as described above, the polarization of the ferroelectric layer 120 may reach a seventh point B3 on the second hysteresis loop 20 of FIG. 4A. Subsequently, the applied voltage may be decreased from the second peak voltage value −Vs1 to 0 V for the time period from time t3 to time t4. At time t4, the polarization of the ferroelectric layer 120 may reach an eighth point B4 on the second hysteresis loop 20, which has a fourth remanent polarization value −P1. As a result, a voltage whose amplitude increases or decreases may be applied for the time period from time t2 to time t4 to generate the remanent polarization having the fourth remanent polarization value −P1 on the second hysteresis loop 20.

Next, the applied voltage may be increased from 0 V to a predetermined first peak voltage value Vs1 for the time period from time t4 to time t5. The first peak voltage value Vs1 may correspond to a third electric field Es1 on the second hysteresis loop 20 of FIG. 4A. The third electric field Es1 may be greater than the first coercive electric field Ec on the first hysteresis loop 10. Accordingly, switching of the polarization from a negative polarization value −P1 to a positive polarization value corresponding to the fifth point B1 can occur in the ferroelectric layer 120 such that the ferroelectric layer 120 has a polarization state having a switched polarization orientation as a whole. In an embodiment, when the ferroelectric layer 120 has the second polarization orientation Pup as a whole at the eighth point B4, the ferroelectric layer 120 has the first polarization orientation Pdn as a whole at the fifth point B1 during the application of the second operating voltage W2. However, at the fifth point B1, not all of domains in the ferroelectric layer 120 have the first polarization orientation Pdn. Instead, the number of domains having the first polarization orientation Pdn may be relatively greater than the number of domains maintaining the second polarization orientation Pup. As an example, the first peak voltage value Vs1 can be derived by multiplying the third electric field Est by the thickness of the ferroelectric layer 120.

At time t5, as described above, the polarization of the ferroelectric layer 120 may reach the fifth point B1 on the second hysteresis loop 20. Subsequently, the applied voltage may be decreased from the first peak voltage value Vs1 to 0 V for the time period from time t5 to time t6. At time t6, the polarization of the ferroelectric layer 120 may reach a sixth point B2 having a third remanent polarization value P1 on the second hysteresis loop 20. As a result, a voltage whose voltage value increases or decreases may be applied for the time period from time t4 to time t6 to generate a remanent polarization having the third remanent polarization value P1 on the second hysteresis loop 20. The remanent polarization having the third remanent polarization value P1 may have the same polarization orientation as the remanent polarization having the first saturation remenent polarization value Pr, but the magnitude of the polarization may be smaller than that of the remanent polarization having the first saturation remenent polarization value Pr. As a result, the saturation remanent polarization value Pr can be converted into the polarization having the third remanent polarization value P1 in ferroelectric layer 120.

In some other embodiments, when the second operating voltage W2 is applied to the ferroelectric layer 120, in FIG. 6A, a voltage corresponding to one-half cycle of the first unit voltage W2a may be further applied for the time period from time t6 to time t8 after applying the first unit voltage W2a corresponding to one cycle from time t2 to time t6. As a result, a remanent polarization having a fourth remanent polarization value −P1 along the hysteresis loop 20 can be generated in ferroelectric layer 120 at t8.

As described above, the application of the second operating voltage W2 may include generating a new ferroelectric hysteresis behavior including the third and fourth remanent polarization values P1 and −P1 in the ferroelectric layer 120. In an embodiment, the application of the second operating voltage W2 may include applying the first unit voltage W2a, that is, the voltage applied for the time period from time t2 to time t6 at least once. As an example, in FIG. 6A, the first unit voltage W2a and the second unit voltage W2b are applied. In another embodiment, in application of the second operating voltage W2, the unit voltage may be repeatedly applied a plurality of times until the ferroelectricity hysteresis behavior of the polarization generated by the application of the second operating voltage W2 becomes substantially the same for each applied unit voltage. That is, in applying the second operating voltage W2, the unit voltage corresponding to one cycle from time t2 to time t6 may be repeatedly applied a plurality of times. As a result, the polarization operation of the ferroelectric layer 120 can be stabilized so that the polarization property of the ferroelectric layer 120 follows the second hysteresis loop 20. According to the second hysteresis loop 20, after the second operating voltage W2 is removed from the ferroelectric layer 120, the ferroelectric layer 120 can have the third and fourth remanent polarization values P1 and −P1 as new saturation remanent polarization values and have the third and fourth electric fields Es1 and −Es1 as new saturation electric fields.

FIG. 7 is a view representing an operating voltage for operating a ferroelectric device in another embodiment of the present disclosure. The operation of the ferroelectric device in FIG. 7 can be described using the ferroelectric device 1 described above and with reference to FIG. 5 and the first and second hysteresis loops 10 and 20 of FIG. 4A.

Referring to FIG. 7, a first operating voltage W'1 may be applied to a ferroelectric layer 120 to generate a remanent polarization at a second point A2 having a first saturation remanent polarization value Pr along the first hysteresis loop 10 of FIG. 4A. In an embodiment, the operating voltage W'1 may have a predetermined voltage value V0 that is kept constant for a predetermined time interval Δt0. The voltage value $V_O$ may be lower than a first saturation voltage value Vs shown in FIG. 6A. In an embodiment, the sum of the voltage values V0 applied for the time period from time t0 to time to may correspond to the total electrical energy provided to the ferroelectric layer 120 to obtain the first saturation remanent polarization value by polarization switching. Accordingly, the remanent polarization in the ferroelectric layer 120 can be controlled to have the first saturation remanent polarization value Pr, after the removal of a pulse that results in a polarization value at A1, by providing the energy of the pulse maintaining a constant voltage value Vo to the ferroelectric layer 120 for a sufficient time period Δt0. Consequently, the polarization of the ferroelectric layer 120 can reach the second point A2 having the first saturation remanent polarization value Pr when the first operating voltage W'1 is removed after the polarization of the ferroelectric layer 120 reaches the first point A1 on the first hysteresis loop 10 of FIG. 4A at time ta.

Then, a second operating voltage W'2 may be applied to the ferroelectric layer 120 in which the remanent polarization having the first saturation remanent polarization value Pr is stored. As illustrated in FIG. 7, the amplitude of the second operating voltage W'2 may be periodically changed in a predetermined voltage range depending on the application time, that is, between a first holding voltage value Vo and a second holding voltage value −Vo. In an embodiment, the second operating voltage W'2 may include a plurality of unit voltages W'2a and W'2b, and each of the unit voltages W'2a and W'2b may be a minimum unit of the applied voltage which is periodically repeated depending on the application time. More specifically, referring to FIG. 7, the second operating voltage W'2 may include a first unit voltage W'2a corresponding to a first cycle of the second operating voltage W'2, which is from time ta to time tc, and a second unit voltage W'2b corresponding to a second cycle of the second operating voltage W'2, which is from time tc to time te. Although two unit voltages W'2a and W'2b are illustrated as the second operating voltage W'2 in FIG. 7, the present disclosure is not limited thereto, and various numbers of unit voltages may be applied to the ferroelectric layer 120 as the second operating voltage W'2.

In an embodiment, each of the first and second unit voltages W'2a and W'2b may include a pulse that maintains a predetermined voltage value Vo, having a positive polarity, during a predetermined first time interval Δt1, followed by a pulse that maintains a predetermined second voltage value −Vo, having a negative polarity, during a predetermined second interval Δt2. At this time, the first time interval Δt1 and the second time interval Δt2 may be the substantially the same. The energy provided by the total sum of the first holding voltages Vo provided to the ferroelectric layer 120 during the first time interval Δt1 can switch the polarization of the ferroelectric layer 120 from the second point A2 having the first saturation remanent polarization value Pr to the eighth point B4 having the fourth remanent polarization value −P1. More specifically, the polarization of the ferroelectric layer 120 can reach the eighth point B4 having the fourth remanent polarization value −P1 when the applied voltage of the negative voltage value −Vo is removed after the polarization of the ferroelectric layer 120 reaches the seventh point B3 on the second hysteresis loop 20 of FIG. 4A at time tb.

Then, the first and second unit voltages W'2a and W'2b may maintain a predetermined voltage value V0 having a positive polarity during the second time interval Δt2. The energy provided by the total sum of the voltage values V0 provided to the ferroelectric layer 120 during the second time interval Δt2 can switch the polarization of the ferroelectric layer 120 from the eighth point B4 having the fourth remanent polarization value −P1 to the sixth point B2 having the third remanent polarization value P1. More specifically, the polarization of the ferroelectric layer 120 can reach the sixth point B2 having the third remanent polarization value P1 when the applied voltage of the positive voltage value Vo is removed after the polarization of the ferroelectric layer 120 reaches the fifth point B1 on the second hysteresis loop 20 of FIG. 4A at time tc.

In some other embodiments, in FIG. 7, an operating voltage corresponding to one-half cycle from time tc to time td may be further applied after the first unit voltage W'2a corresponding to one cycle from time to to time tc is applied. As a result, the polarization of the ferroelectric layer 120 can be switched to the eighth point B4 having the fourth remanent polarization value −P1 along the hysteresis loop 20. Consequently, the remanent polarization having the fourth remanent polarization value −P1 can be stored.

As described above, the process of applying the second operating voltage W'2 may include generating a new ferroelectricity hysteresis behavior including the remanent polarization having the third and fourth remanent polarization values P1 and −P1 in the ferroelectric layer 120. In an embodiment, the process of applying the second operating voltage W'2 may include applying the first unit voltage W'2a, that is, the voltage applied for the time period from time ta to time tc at least once. As an example, in FIG. 7, the first unit voltage W'2a and the second unit voltage W'2b are applied. In another embodiment, in the process of applying the second operating voltage W'2, the application of the unit voltage can be repeated a plurality of times until the ferroelectricity hysteresis behavior of the polarization generated by the application of the second operation voltage W'2 becomes substantially the same for each applied unit voltage. That is, the process of applying the second operating voltage W'2 may be performed by repeatedly applying the unit voltage corresponding to one cycle from time ta to time tc. As a result, the polarization operation of the ferroelectric layer 120 can be stabilized so that the polarization property follows the second hysteresis loop 20. According to the second hysteresis loop 20, after the second operating voltage W'2 has been removed from the ferroelectric layer 120, the ferroelectric layer 120 may have the third and fourth remanent polarization values P1 and −P1, and may have the third and fourth electric fields Es1 and −Es1 as new saturation electric fields.

Figure 8:
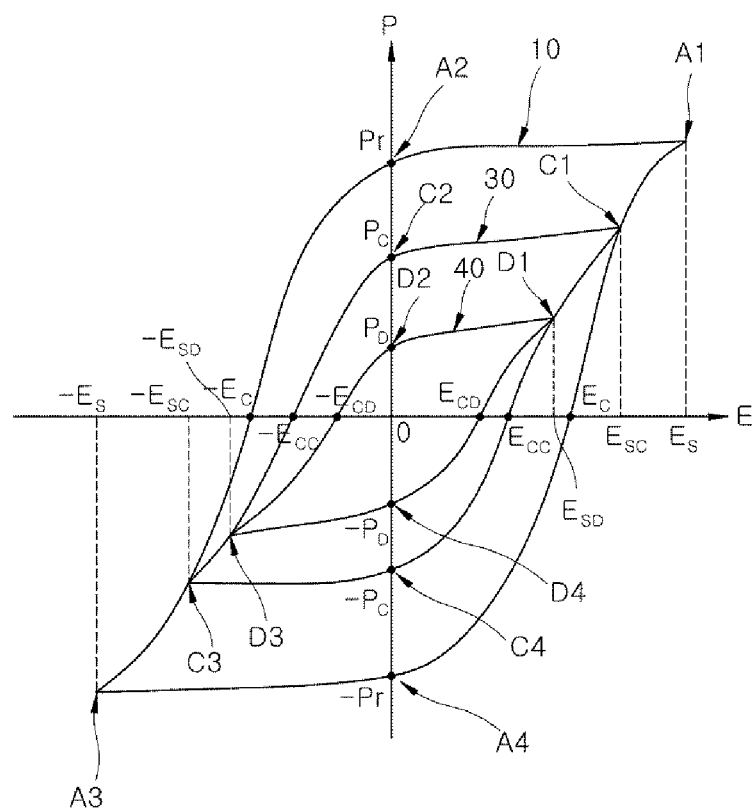
FIG. 8 is a graph schematically illustrating a method of writing multiple levels of remanent polarization according to another embodiment of the present disclosure.

FIG. 8 is a graph schematically illustrating a polarization writing method of a plurality of levels according to another embodiment of the present disclosure. The operation of the ferroelectric device of FIG. 8 may be described using the ferroelectric device 1 described above and with reference to FIG. 5.

Different hysteresis loops 30 and 40 that are differentiated from the first hysteresis loop 10 illustrated in FIG. 8 can be formed with respect to the ferroelectric layer 120 by performing substantially the same operation as the operation of the ferroelectric device described above and with reference to FIGS. 5, 6A to 6B and 7. Any one of the hysteresis loops 30 and 40 may be the same as the second hysteresis loop 20 as shown in FIG. 4A. Alternatively, the hysteresis loops 30 and 40 may be different from the second hysteresis loop 20 as shown in FIG. 4A. For convenience of description, the hysteresis loops 30 and 40 will be referred to as a third hysteresis loop 30 and a fourth hysteresis loop 40, respectively.

Referring to FIG. 8, a third hysteresis loop 30 having a ninth point C1, a tenth point C2, an eleventh point C3 and a twelfth point C4 may be generated for the ferroelectric layer 120, with C1 and C3 along the first hysteresis loop 10. At this time, a positive saturation remanent polarization value Pc at the tenth point C2 can be obtained by applying a voltage corresponding to a positive maximum electric field Esc to the ferroelectric layer 120 (previously having the second saturation remanent polarization value −Pr at the fourth point A4), and then removing the voltage. A negative saturation remanent polarization value −Pc at the twelfth point C4 can be obtained by applying a voltage corresponding to a negative maximum electric field −Esc to the ferroelectric layer 120 (previously having the first saturation remanent polarization value Pr at the second point A2), and then removing the voltage. As described above, the third hysteresis loop 30 can be generated by applying an operating voltage corresponding to the electric field between the positive maximum electric field Esc and the negative maximum electric field −Esc along the first hysteresis loop 10 while changing an amplitude of the operating voltage within a voltage application time period and within a set voltage range. The third hysteresis loop 30 may have predetermined coercive electric fields $E_{CC}$ and $-E_{CC}$.

In addition, the fourth hysteresis loop 40 having a thirteenth point D1, a fourteenth point D2, a fifteenth point D3 and a sixteenth point D4 can be generated for the ferroelectric layer 120, with D1 and D3 along the third hysteresis loop 30. At this time, a positive saturation remanent polarization value $P_D$ at the fourteenth point D2 can be obtained by applying a voltage corresponding to a positive maximum electric field $E_{SD}$ to the ferroelectric layer 120 (previously having the negative saturation remanent polarization value −Pc at the twelfth point C4), and then removing the voltage. A negative saturation remanent polarization value $-P_D$ at the sixteenth point D4 can be obtained by applying a voltage corresponding to a negative maximum electric field $-E_{SD}$ to the ferroelectric layer 120 (previously having the positive saturation remanent polarization value Pc at the tenth point C2), and then removing the voltage. As described above, the fourth hysteresis loop 40 can be generated by applying, with respect to the ferroelectric layer 120, an operating voltage corresponding to the electric field between the positive maximum electric field $E_{SD}$ and the negative maximum electric field $-E_{SD}$ along the third hysteresis loop 30 while changing an amplitude of the operating voltage within a voltage application time period and within a set voltage range. The fourth hysteresis loop 40 may have predetermined coercive electric fields $E_{CD}$ and $-E_{CD}$.

Consequently, a plurality of remanent polarization states having remanent polarization values smaller than the first and second saturation remanent polarization values Pr and −Pr on the first hysteresis loop 10 can be implemented to store a plurality of information signals corresponding to a plurality of remanent polarization states, respectively. Each of the plurality of remanent polarization may be controlled to reliably follow the corresponding hysteresis loop. As a result, the plurality of remanent polarization can be stabilized in terms of energy in the ferroelectric layer 120.

Figure 9:
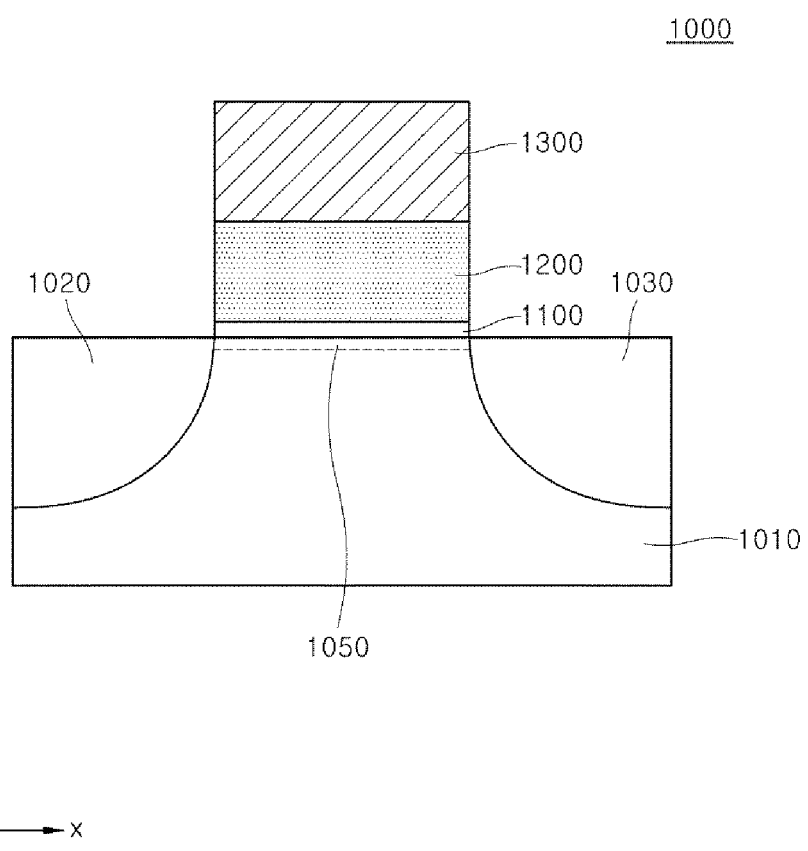
FIG. 9 is a cross-sectional view schematically illustrating a ferroelectric device according to an embodiment of the present disclosure.
Figure 10:
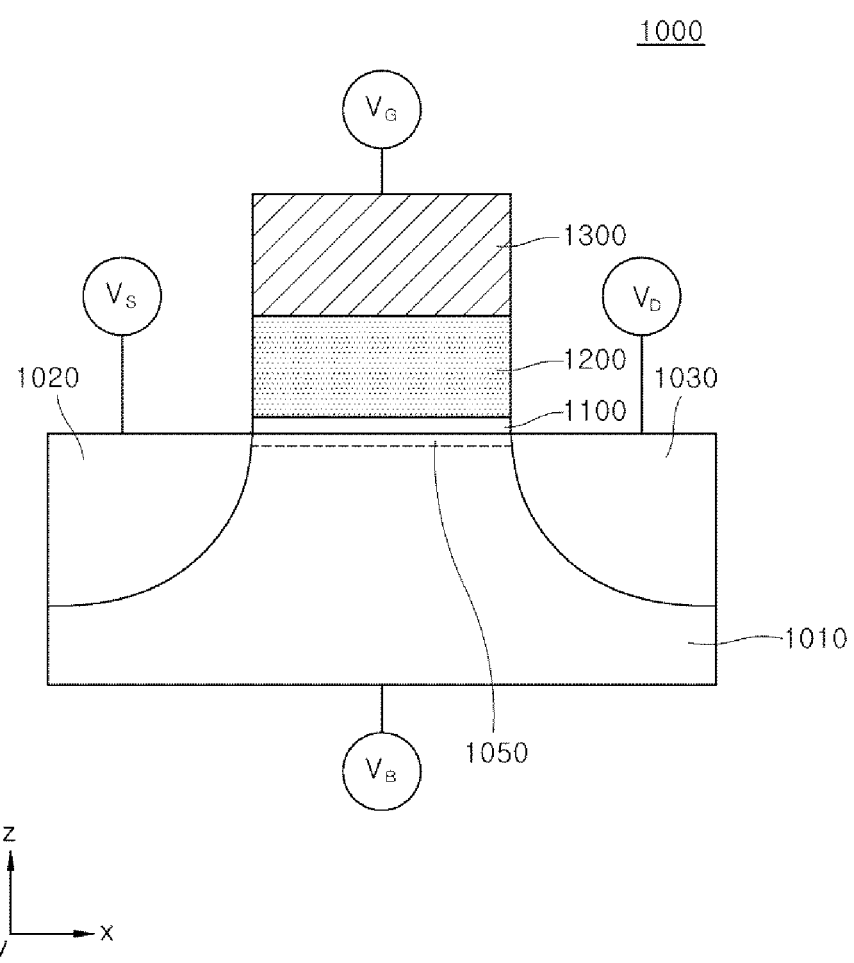
FIG. 10 is a view schematically illustrating a method of operating a ferroelectric device according to an embodiment of the present disclosure.

FIG. 9 is a cross-sectional view schematically illustrating a ferroelectric device 1000 according to an embodiment of the present disclosure. FIG. 10 is a view schematically illustrating a method of operating the ferroelectric device 1000 according to an embodiment of the present disclosure.

Referring to FIG. 9, the ferroelectric device 1000 may be a transistor-type nonvolatile memory device. The ferroelectric device 1000 may include a substrate 1010 and an interfacial insulation layer 1100, ferroelectric layer 1200 and a gate electrode layer 1300 which are sequentially disposed on the substrate 1010. In addition, the ferroelectric device 1000 may include a source electrode 1020 and a drain electrode 1030 disposed in the substrate 1010 at both ends of the gate electrode layer 1300 or the interfacial insulation layer 1100. A channel layer 1050 may be disposed in a region of the substrate 1010 under the interfacial insulation layer 1100.

The substrate 1010 may include, for example, a semiconductor material. The substrate 1010 may be a silicon (Si) substrate, a gallium arsenide (GaAs) substrate, an indium phosphide (InP) substrate, a germanium (Ge) substrate, or a silicon germanium (SiGe) substrate, as non-limiting examples. The substrate 1010 may be doped with an n-type dopant or a p-type dopant to have conductivity.

The source and drain electrodes 1020 and 1030 may be regions doped with a dopant. The source and drain electrodes 1020 and 1030 may be regions doped into opposite conductivity type to the semiconductor substrate 1010.

The interfacial insulation layer 1100 may serve as a barrier layer for suppressing material exchange between the substrate 1010 and the ferroelectric layer 1200. When the substrate 1010 is a silicon substrate and the ferroelectric layer 1200 is a hafnium oxide layer, the interfacial insulation layer 1100 may be disposed between the silicon substrate and the hafnium oxide layer, so that the generation of defects at the interface between the silicon substrate and the hafnium oxide layer can be suppressed. The interfacial insulation layer 1100 may include silicon oxide, silicon nitride, or silicon oxynitride, as non-limiting examples.

The ferroelectric layer 1200 may function as an information storage layer for storing remanent polarization as an information signal. In an embodiment, the remanent polarization in the ferroelectric layer 1200 may have a first polarization orientation Pdn throughout the entire domains, such as the ferroelectric layer 120 illustrated in FIG. 2A. In another embodiment, the remanent polarization in the ferroelectric layer 1200 may have a second polarization orientation Pup throughout the entire domains, such as the ferroelectric layer 120 illustrated in FIG. 2B. In another embodiment, the remanent polarization in the ferroelectric layer 1200 may have the first polarization orientation Pdn in some domains and may have the second polarization orientation Pup in the remaining domains, such as the ferroelectric layer 120 illustrated in FIG. 2C. A plurality of levels of the remanent polarization state can exist depending on the ratio of the domains having the first polarization orientation Pdn and the domains having the second polarization orientation Pup.

The ferroelectric layer 1200 may include hafnium oxide, zirconium oxide, or hafnium zirconium oxide, as non-limiting examples. As another example, the ferroelectric layer 1200 may include a perovskite-based material such as lead zirconate titanate (PZT) and strontium bismuth tantalite (SBT).

The gate electrode layer 1300 may be disposed on the ferroelectric layer 1200. The gate electrode layer 1300 may include a conductive material. The gate electrode layer 1300 may include tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof, as non-limiting examples.

When a predetermined write voltage is applied to the ferroelectric layer 1200 through the gate electrode layer 1300, a plurality of levels of remanent polarization values can be recorded or stored in the ferroelectric layer 1200. The method of applying the predetermined write voltage to the ferroelectric layer 1200 is substantially the same as the method of operating the ferroelectric device described above and with reference to FIGS. 5, 6A to 6B, 7 and 8. Referring to FIG. 10, in order to apply the write voltage, a substrate voltage $V_B$, a source voltage $V_S$, and a drain voltage $V_D$ may be maintained at the same potential. Specifically, the substrate 1010, the source electrode 1020 and the drain electrode 1030 may each be kept in a grounded state. And, a predetermined gate voltage $V_G$ may be applied in a write operation to result in a predetermined level of remanent polarization in the ferroelectric layer 1200. The predetermined gate voltage $V_G$ may be substantially the same as the second operation voltages W2 and W2' described above and with reference to FIGS. 5, 6A to 6B, 7 and 8.

When a predetermined read voltage is applied to the ferroelectric layer 1200 through the gate electrode layer 1300, the remanent polarization stored in the ferroelectric layer 1200 can be read. Referring to FIG. 10, the gate voltage $V_G$ and the substrate voltage $V_B$ applied to the substrate 1010 and the gate electrode layer 1300 may be controlled so that a read voltage equal to or higher than a predetermined threshold voltage is applied between the substrate 1010 and the gate electrode layer 1300. Accordingly, a channel layer 1050 can be formed in the substrate 1010. At this time, different types and different amounts of charges can be induced into the channel layer 1050 depending on the magnitude of the stored remanent polarization in the ferroelectric layer 1200. In an embodiment, the remanent polarization having the first polarization orientation $P_{dn}$ stored in the ferroelectric layer 1200 of the NMOS transistor-type ferroelectric device 1000 can induce electrons from the substrate 1010 towards and into the channel layer 1050. As the ratio of the polarization with the first polarization orientation Pdn of the remanent polarization becomes larger, the density of the electrons induced in the channel layer 1050 can increase. Next, the source voltage $V_S$ and the drain voltage $V_D$ may be controlled to apply a predetermined voltage between the source electrode 1020 and the drain electrode 1030 so that an operating current can flow through the channel layer 1050. It is possible to determine the magnitude of the remanent polarization stored in the ferroelectric layer 1200 by measuring the operating current. As an example, as the density of the electrons induced in the channel layer 1050 increases, the thickness of the channel layer 1050 increases, so that a relatively large operating current can be measured.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A method of operating a ferroelectric device, the method comprising:
providing a ferroelectric device including a first electrode layer, a ferroelectric layer and a second electrode layer that are sequentially disposed;
applying a first operating voltage between the first and second electrode layers to write a first remanent polarization stored as a first level information signal; and
applying a second operating voltage between the first and second electrode layers to write a second remanent polarization stored as a second level information signal, the second remanent polarization having a polarization value of an absolute value different from an absolute value of the first remanent polarization in the ferroelectric layer,
wherein an amplitude of the operating voltage varies within a voltage application time period and varies within a set voltage range.

2. The method of claim 1, wherein the second operating voltage comprises a plurality of unit voltages, wherein the unit voltage is a minimum unit of the operating voltage, and wherein the unit voltage is periodically repeated.

3. The method of claim 1, wherein the second operating voltage varies between a positive peak voltage and a negative peak voltage of substantially the same absolute value in magnitude.

4. The method of claim 1, wherein the second operating voltage is a voltage whose magnitude substantially continuously increases or decreases within the voltage application time period.

5. The method of claim 4, wherein the second operating voltage is an analog voltage signal.

6. The method of claim 3, wherein the second operating voltage comprises a pulse that maintains a predetermined voltage value having a positive polarity during a predetermined time interval and a pulse that maintains a predetermined voltage value having a negative polarity during a predetermined time interval.

7. The method of claim 1, further comprising generating at least one ferroelectricity hysteresis behavior resulting in the retention of the second remanent polarization in the ferroelectric layer as at least one distinctive remanent polarization.

8. The method of claim 7, further comprising repeating application of the second operating voltage to repeat the ferroelectricity hysteresis behavior one or more times.

9. The method of claim 1, wherein a polarization orientation of the first remanent polarization and a polarization orientation of the second remanent polarization are substantially the same.

10. The method of claim 1, wherein a polarization value of the second remanent polarization is smaller than a polarization value of the first remanent polarization.

11. A method of operating a ferroelectric device, the method comprising:
providing a ferroelectric device including a first electrode layer, a ferroelectric layer and a second electrode layer that are sequentially disposed;
applying a first operating voltage to the ferroelectric layer to write a maximum remanent polarization in the ferroelectric layer stored as a first level information signal; and
applying a second operating voltage to the ferroelectric layer to write a predetermined remanent polarization stored as a second level information signal, the predetermined remanent polarization being smaller than a maximum remanent polarization in the ferroelectric layer,
wherein the second operating voltage provides a second saturation electric field lower than a first saturation electric field that generates the maximum remanent polarization for the ferroelectric layer,
wherein applying the second operating voltage generates a new ferroelectricity hysteresis behavior comprising the predetermined remanent polarization in the ferroelectric layer.

12. The method of claim 11, wherein the second operating voltage comprises a plurality of unit voltages, wherein the unit voltage is a minimum unit of the operating voltage, and wherein the unit voltage is periodically repeated.

13. The method of claim 12, further comprising repeating the application of the second operating voltage to repeat the ferroelectricity hysteresis behavior one or more times.

14. The method of claim 11, wherein a polarization orientation of the predetermined remanent polarization and a polarization orientation of the maximum remanent polarization are substantially the same.

15. The method of claim 11, wherein the second operating voltage varies periodically between a positive peak voltage and a negative peak voltage of the same magnitude with respect to each other on the basis of zero voltage (0 V).

16. The method of claim 11, wherein the second operating voltage is a voltage whose magnitude substantially continuously increases or decreases depending on the application time.

17. The method of claim 11, wherein the second operating voltage is an analog voltage signal.

18. The method of claim 12, wherein the second operating voltage comprises a pulse that maintains a predetermined voltage value having a positive polarity during a predetermined time interval and a pulse that maintains a predetermined voltage value having a negative polarity during a predetermined time interval.

* * * * *